(12) United States Patent
Kuisma

(10) Patent No.: US 8,794,797 B2
(45) Date of Patent: Aug. 5, 2014

(54) HYBRID ILLUMINATOR

(75) Inventor: Jouko Kuisma, Lahti (FI)

(73) Assignee: Teknoware Oy, Lahti (FI)

( * ) Notice: Subject to any disclaimer, the term of this patent is extended or adjusted under 35 U.S.C. 154(b) by 755 days.

(21) Appl. No.: 10/969,520

(22) Filed: Oct. 20, 2004

(65) Prior Publication Data

US 2005/0117351 A1    Jun. 2, 2005

(30) Foreign Application Priority Data

Nov. 7, 2003  (FI) ...................................... 20031619

(51) Int. Cl.
| | | |
|---|---|---|
| *F21V 29/00* | (2006.01) | |
| *F21K 99/00* | (2010.01) | |
| *H05K 1/02* | (2006.01) | |
| *H01L 25/16* | (2006.01) | |
| *H01L 23/367* | (2006.01) | |
| *H05K 3/00* | (2006.01) | |

(52) U.S. Cl.
CPC .... H05K 1/0203 (2013.01); *H05K 2201/10106* (2013.01); *H05K 3/0061* (2013.01); F21K 9/00 (2013.01); *H05K 2201/0999* (2013.01); H01L 25/167 (2013.01); H01L 23/3675 (2013.01)
USPC ............................ 362/294; 362/373; 362/345

(58) Field of Classification Search
USPC .................................. 362/294, 800, 373, 345
See application file for complete search history.

(56) References Cited

U.S. PATENT DOCUMENTS

| | | | |
|---|---|---|---|
| 6,045,240 A * | 4/2000 | Hochstein | ...................... 362/294 |
| 6,201,346 B1 | 3/2001 | Kusaka | |
| 6,313,955 B1 | 11/2001 | Yoneyama | |
| 6,318,886 B1 * | 11/2001 | Stopa et al. | .................... 362/800 |
| 6,402,347 B1 | 6/2002 | Maas et al. | |
| 6,578,994 B1 | 6/2003 | Beyerlein | |
| 6,641,284 B2 * | 11/2003 | Stopa et al. | .................... 362/294 |
| 6,948,823 B2 * | 9/2005 | Pohlert et al. | ................. 362/800 |
| 7,214,952 B2 * | 5/2007 | Klipstein et al. | ............... 362/244 |
| 2002/0159270 A1 * | 10/2002 | Lynam et al. | .................. 362/492 |

(Continued)

FOREIGN PATENT DOCUMENTS

| | | |
|---|---|---|
| DE | 88 15 418 U1 | 3/1989 |
| DE | 90 03 623 U1 | 12/1990 |

(Continued)

OTHER PUBLICATIONS

Philips Lumileds Lighting Company, "LUXEON® Reliability Datasheet RD25," obtained from the internet at http://www.lumileds.com/pdfs/RD25.pdf (Jul. 2006).

(Continued)

*Primary Examiner* — William Carter

(74) *Attorney, Agent, or Firm* — Leydig, Voit & Mayer, Ltd.

(57) ABSTRACT

The present invention relates to an illuminator apparatus comprising one or more LEDs and one or more current control components and/or other illuminator components coupled in a thermally conductive manner to a circuit board. The circuit board, in turn, is in a thermally conductive manner integrated into a cooling element which serves as a frame part of the illuminator in order to transfer heat generated by the LEDs and the current control components and/or the other components through the circuit board to the cooling element and therefrom further to other structures of the illuminator and to an ambient environment.

17 Claims, 2 Drawing Sheets

(56) References Cited

U.S. PATENT DOCUMENTS

| | | |
|---|---|---|
| 2003/0002256 A1 | 1/2003 | Tano |
| 2003/0048641 A1 | 3/2003 | Alexanderson et al. |
| 2003/0063463 A1 | 4/2003 | Sloan et al. |
| 2003/0072153 A1 | 4/2003 | Matsui et al. |
| 2003/0117797 A1 | 6/2003 | Sommers et al. |
| 2003/0174517 A1 | 9/2003 | Kiraly et al. |
| 2003/0193816 A1 | 10/2003 | Rahn |
| 2004/0066142 A1 | 4/2004 | Stimac et al. |

FOREIGN PATENT DOCUMENTS

| | | |
|---|---|---|
| DE | 199 26 561 A1 | 12/2000 |
| DE | 101 62 404 A1 | 7/2003 |
| EP | 0869388 | 10/1998 |
| EP | 0 920 055 A2 | 6/1999 |
| EP | 1039597 | 9/2000 |
| EP | 1 439 120 A2 | 7/2004 |
| WO | WO 00/36336 | 6/2000 |

OTHER PUBLICATIONS

Day, Michael, "LED-driver considerations," *Analog Applications Journal*, obtained from the internet at http://focus.ti.com/lit/an/slyt084/slyt084.pdf (2004).

* cited by examiner

HYBRID ILLUMINATOR

BACKGROUND OF THE INVENTION

The invention relates to an illuminator apparatus in accordance with the preamble of claim 1. The present invention particularly relates to cooling down an illuminator comprising LEDs.

In connection with prior art LED illuminators, the question of voltage adaptation has to be taken into account while manufacturing such illuminators. LED is an abbreviation of a light emitting diode. When forward current is supplied through a LED, the power remaining in the diode emits light. The drop in voltage of one LED unit is approximately 2.0 to 4.0 V. The drop in voltage is determined according to the current, substantially in accordance with a dynamic release curve of a conventional diode. The drop in voltage, in turn, causes the temperature in the illuminator and all its components to rise.

As technology advances, more and more efficient LEDs whose efficiencies range from 0.1 to up to 5 W have become available on the market. The efficiencies tend to further increase as the technology advances. However, the illuminating efficiency of a LED is of the same order of magnitude as that of a filament lamp, i.e. 6 to 8%. As is typical of all chemical reactions, it is also typical of LEDs that their life expectancy decreases as temperature rises (the Arrhenius equation), i.e. as the drop in voltage increases.

In prior art illuminators, when the voltage in a LED exceeds a threshold value of the release voltage, the value of the current increases without limit, which is why the current of LEDs usually has to be limited by an external component, e.g. a resistor. Since the efficiencies of new LEDs are constantly on the increase, it is no longer economical or even technically possible to connect LEDs in series and limit the current of a single LED by a resistor; instead, an electronic low-loss coupling element, a so-called chopper power supply, is to be used for the purpose.

Such a chopper power supply enables current to be supplied to a LED from a higher current to limit the current to a correct value for the LED with very small losses. An example is e.g. a current of 300 mA to be taken for a LED of 1000 mW. In such a case, a chopper drops the current about 20 V which, limited by a resistor, causes a power loss of approximately 6 W. This means an electric efficiency of only approximately 15% for the entire coupling. When the supply voltage is 230 V, the efficiency is only a fraction of the above. When the illuminating efficiency of the LED is also taken into account, the illuminating efficiency of the entire coupling is only approximately 2 to 3%. The corresponding total electric efficiency of the chopper per power supply is approximately 95%. In low-power LED solutions, this power loss has no economic importance but when one single application may comprise several dozens of LED lights, the power loss becomes important and at the same time the inside temperature of the illuminator rises, which, in turn, shortens the life of the LEDs and other components. Therefore, the prior art illuminator solutions no longer suit economically to be used in illuminators comprising a plurality of high-power LEDs of 0.1 to 5 W.

BRIEF DESCRIPTION OF THE INVENTION

An object of the invention is thus to provide an illuminator in accordance with the preamble of claim 1 to enable the aforementioned problems to be solved. The object of the invention is achieved by an illuminator wherein the illuminator comprises one or more LEDs and one or more current control components and/or other illuminator components coupled in a thermally conductive manner to a circuit board, and at least one cooling element which serves as a frame part of the illuminator and which is integrated in the circuit board in a thermally conductive manner in order to transfer heat generated by the current control components and/or the other components through the circuit board to the cooling element and further to other structures of the illuminator and to an ambient environment.

Preferred embodiments of the invention are disclosed in the dependent claims.

The invention is based on the idea that an illuminator comprising one or more LEDs, high-power LEDs of 0.1 to 5 W in particular, which have been mounted to a circuit board and which derive their current from a power source which supplies power thereto, heats up as a result of a power loss caused by the LEDs and other components, and this shortens the life of the LEDs and the other components. Thus, according to the invention, the LEDs and the components controlling the same are attached to a printed circuit board which is further attached in a thermally conductive manner to a cooling element serving as a frame of the illuminator, the purpose of the cooling element being to transfer the generated heat away from the circuit board and the components therein to other structures of the illuminator and therefrom further to an ambient environment. Preferably, the cooling element is a metal plate/profile integrated in the circuit board in a thermally highly conductive manner, the LEDs and the components controlling the same also being attached to the circuit board in a thermally highly conductive manner. A transfer of heat from the circuit board and the components therein as well as from the vicinity thereof carried out in this manner enables a long life for the LEDs and the components. Thus, in accordance with the invention, a compact illuminator is achieved wherein LEDs and current control components as well as possible other illuminator components are mounted in a thermally conductive manner to a printed circuit board which, in turn, is attached in a thermally conductive manner to a cooling element serving as a frame or a part thereof of the illuminator, the cooling element preferably being a thermally conductive metal plate or profile.

An advantage of the method and system of the invention is that it makes compact power source-illuminator structures possible wherein a power source and light sources are well-cooled in a tight structure. It is then possible to keep the lives of LEDs and other components even in a tight structure normal.

In a preferred embodiment of the present invention, a cooling element forms at least a part of the frame of the illuminator, the cooling element being a thermally highly conductive plate or a profile, preferably a metal plate/profile or a metal coating, attached to a circuit board. Furthermore, in a preferred embodiment of the present invention, the circuit board in its entirety is mounted to the surface of the cooling element(s); however, the circuit board may also be mounted to the surface of the cooling element only partially.

In a second embodiment of the present invention, a cooling element consists of two or more coatings, plates or profiles or a combination thereof arranged on top of each other.

In accordance with the features of the invention, the circuit board is attached to a cooling element by a heat-conductive glue, mechanically or by vulcanizing in order to transfer heat effectively through the circuit board to the cooling element.

BRIEF DESCRIPTION OF THE DRAWINGS

The invention is now described in closer detail in connection with the preferred embodiments and with reference to the accompanying drawings, in which.

DETAILED DESCRIPTION OF THE INVENTION

Figure 1:
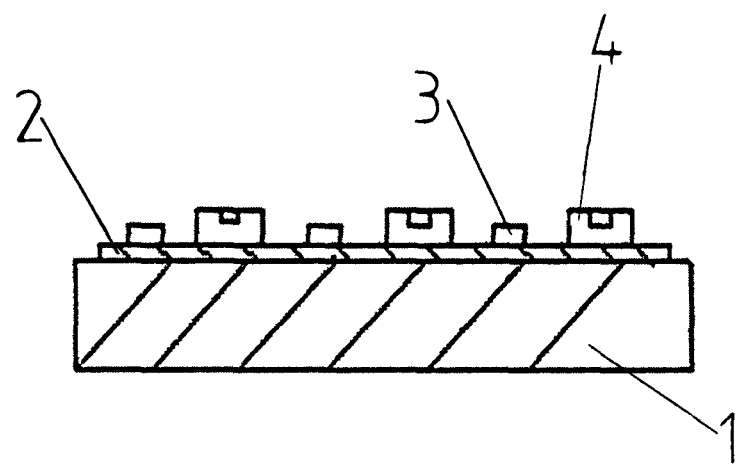
FIG. 1 is a schematic view showing an illuminator apparatus of the invention, equipped with a cooling element.

Referring to FIG. 1, a schematic view is shown therein of an illuminator arrangement according to the present invention wherein LEDs 4 are mounted to a circuit board 2 to which, in turn, a cooling element 1 is attached. The circuit board 2 may be e.g. a printed circuit board made of a glass fiber laminate, one side or both sides thereof being provided with an electrically and thermally conductive copper foil or copper conductors; such printed circuit boards are commonly used when manufacturing components called multilayer printed circuit boards. However, in addition to the above, a circuit board may also be a circuit board of another kind or a printed circuit board wherein instead of a copper foil some other conductor of electricity is used, and instead of a glass fiber laminate some other base material is used. Such a circuit board may also be a part of a larger entity and, depending on the application, in addition to the basic illuminator components it may comprise several other components.

According to the present invention, the circuit board 2 is attached to the cooling element 1 which in this exemplary embodiment is an aluminum plate whose purpose is to transfer heat generated by the LEDs 4 and the components 3 provided in the circuit board 2 away from the circuit board 2. The aluminum plate also serves as a frame part of the illuminator, transferring heat also to other structures of the illuminator and therethrough efficiently to the ambient air. The cooling element 1 may also be made of another metal, alloy or another thermally highly conductive material. The circuit board 2 is attached to the cooling element in a manner which enables as efficient heat transfer as possible. In this embodiment, the circuit board 2 is attached to the cooling element 1 by using a thermally highly conductive glue. However, the attachment could also be carried out e.g. by vulcanizing the circuit board 2 to the cooling element 1. The attachment may also be implemented mechanically, using silicon paste, which enhances thermal conductivity, or another material which enhances heat transfer, between a circuit board and an aluminum plate. Hence, a thermally highly conductive, integrated structure is achieved which is formed by the circuit board 2 and the cooling element 1.

In this embodiment, the components 3 in the circuit board 2 are current control components, but they may also be other components related to the operation of the illuminator. The current control components, in turn, comprise an active, current-limiting converter, such as a chopper power supply.

The cooling elements 1 may have the shape of plates or different profiles. The profiles may vary freely as necessary and according to the space available in the illuminator apparatus. Alternatively, the cooling element 1 may be a thin coating provided in the circuit board 2. Such cooling elements 1 may also consist of two or more layers having a similar or a different thermal transfer capacity. In such a case, e.g. a thin, thermally highly conductive coating may be attached to the circuit board which, in turn, is attached to the thermally highly conductive frame of the illuminator, thus achieving a two-layer cooling element.

From the cooling element 1, the heat generated by the LEDs 4 and the other components 3 is preferably transferred to the frame of the illuminator apparatus and therefrom further to an ambient environment. This transfer of heat from the cooling element 1 to the environment is achieved simply e.g. by attaching the circuit board to the frame of the illuminator apparatus in a thermally conductive manner, in which case the cooling element 1 forms at least a part of the frame of the illuminator. The lost heat generated by the components of the illuminator can then be transferred to the environment continuously, thus preventing the illuminator from heating up excessively. The circuit board 2 can then be selected such that it is easy to attach to the frame (the cooling element) of the illuminator to enable an attachment thermally as highly conductive as possible to be achieved. In such a case, the circuit board may be only partially integrated in the cooling element 1 so that a part of its surface area is not integrated at all in the cooling element 1 or thus into the frame of the illuminator. Alternatively and preferably, however, the circuit board 2 is integrated over its entire surface area into the cooling element 1, i.e. the frame of the illuminator.

The power of the LEDs 4 used in prior art illuminator apparatuses may be as high as 0.1 to 5 W, which means that the lost heat they generate has a great importance as far as warming up of the illuminator apparatus is concerned. The LEDs and the power source supplying the current thereto, or some of its components and other components 3 of the illuminator apparatus are attached to a circuit plate, preferably to a printed circuit board, which constitutes a mechanic, electric and thermally conductive base for attachment for these LEDs 4 and components 3. Since the LEDs 4 and the components 3 themselves also heat up when the illuminator apparatus is used, they are preferably attached to the circuit board 2 in a thermally highly conductive manner. In practice, they are attached using a thermally highly conductive glue or silicon paste, for instance. Thus, the lost heat generated during use can be transferred as efficiently as possible directly from the LEDs 4 and the components 3 through the circuit board 2 to the cooling element 1 and therefrom, through the frame of the illuminator apparatus, further to an ambient environment.

By following the above-disclosed principles according to the present invention, a structure for an illuminator is achieved which is a compact structure wherein LEDs, the power source(s) thereof and other possible components are mounted to a cooling plate circuit board structure which is thermally highly conductive (highly conductive in terms of dissipation power) such that a "hybrid structure" is provided wherein the cooling plate constitutes at least a part of the frame of the illuminator whereto the circuit plate including its components has been attached in a manner as thermally conductive as possible. When using such a structure according to the invention, the structure of an illuminator comprising LEDs whose efficiency is 0.1 to 5 W, or even higher, can be made a compact and uniform entity without the life of the LEDs or other components shortening considerably due to the influence of lost heat being generated.

Figure 2:
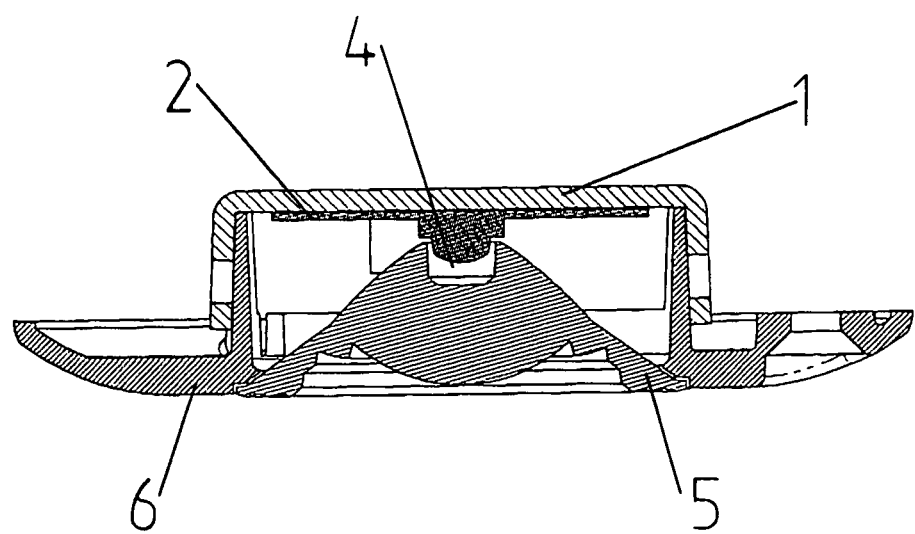
FIG. 2 is a view showing an illuminator according to the present invention.

FIG. 2 shows an example of a preferred embodiment of the present invention. In this embodiment, a circuit board 2 in an illuminator whereto LEDs 4, current control components and other possible components have been mounted is, in a thermally conductive manner, attached to a plate 1 which is preferably made of aluminum and which constitutes a part of the frame of the illuminator and which, at the same time, constitutes a cooling element 1. In this embodiment, the frame of the illuminator also comprises a second frame part 6 which, depending on the embodiment, may be made of the same material as the cooling element 1, or it may be made of a different material. The illuminator further comprises a frame part 5 which constitutes a substantially transparent lens 5 of the illuminator. Thus, in such a solution, heat generated by the LEDs and other components is transferred from the aluminum plate 1, which serves as a part of the frame and to which the circuit board is attached, to an ambient environment. In such a solution, the illuminator consists of an integral uniform element wherein LEDs and current control components as well as a circuit board comprising possible other components and possibly also a lens part to be included in the same integral entity are attached to the frame or a part thereof which serves as the cooling element of the illuminator. This solution according to the invention provides as compact and uniform an illuminator as possible wherein the life of components does not differ from normal.

It is obvious to one skilled in the art that as technology advances, the basic idea of the invention can be implemented in many different ways. The invention and its embodiments are thus not restricted to the above-described examples but they may vary within the scope of the claims.

The invention claimed is:

1. An illuminator apparatus comprising a circuit board, at least one LED, at least one current-limiting converter, and at least one cooling element, wherein the LED and the current-limiting converter are mounted and coupled in a thermally conductive manner to the circuit board, and the cooling element serves as a frame part of the illuminator and is integrated into the circuit board in a thermally conductive manner in order to transfer heat generated by the LED and the current-limiting converter away from the circuit board and to other structures of the illuminator and to an ambient environment such that the LED and the current-limiting converter are cooled with the cooling element being common.

2. The illuminator as claimed in claim 1, wherein the cooling element is at least one of a thermally highly conductive plate or a profile attached to the circuit board.

3. The illuminator as claimed in claim 1, wherein the cooling element is at least one of a metal plate, profile or a metal coating.

4. The illuminator as claimed in claim 3, wherein the cooling element is at least one of an aluminum plate, profile or an aluminum coating.

5. The illuminator as claimed in claim 1, wherein the at least one cooling element comprises a surface, and the circuit board in its entirety is mounted to said surface of the at least one cooling element.

6. The illuminator as claimed in claim 1, wherein the at least one cooling element comprises a surface, and the circuit board is only partially mounted to said surface of the at least one cooling element.

7. The illuminator as claimed in claim 1, wherein the cooling element consists of at least two coatings, plates or profiles, or any combination thereof, arranged on top of one another.

8. The illuminator as claimed in claim 1, wherein the circuit board is attached to the cooling element by means of thermally conductive glue in order to transfer heat efficiently through the circuit board to the cooling element.

9. The illuminator as claimed in claim 1, wherein the circuit board is attached to the cooling element mechanically and by means of a thermally conductive silicon paste in order to transfer heat through the circuit board to the cooling element.

10. The illuminator as claimed in claim 1, wherein the circuit board is attached to the cooling element by means of a heat-activated glue in order to transfer heat through the circuit board to the cooling element.

11. The illuminator as claimed in claim 1, wherein the cooling element is at least one of a metal plate, profile or a metal coating.

12. The illuminator as claimed in claim 11, wherein the cooling element is at least one of an aluminum plate, profile or an aluminum coating.

13. The illuminator as claimed in claim 12, wherein the at least one cooling element comprises a surface, and the circuit board in its entirety is mounted to said surface of the at least one cooling element.

14. The illuminator as claimed in claim 13, wherein the cooling element consists of at least two coatings, plates or profiles, or any combination thereof, arranged on top of one another.

15. The illuminator as claimed in claim 14, wherein the circuit board is attached to the cooling element by means of thermally conductive glue, mechanical attachment, thermally conductive silicon paste, or heat-activated glue in order to transfer heat efficiently through the circuit board to the cooling element.

16. The illuminator as claimed in claim 15, wherein the circuit board is attached to the cooling element by means of mechanical attachment and by means of a thermally conductive silicon paste in order to transfer heat through the circuit board to the cooling element.

17. The illuminator as claimed in claim 12, wherein the at least one cooling element comprises a surface, and the circuit board is only partially mounted to said surface of the at least one cooling element.

* * * * *